United States Patent
Yamazaki et al.

(10) Patent No.: US 7,115,434 B2
(45) Date of Patent: Oct. 3, 2006

(54) METHOD FOR PRECISELY FORMING LIGHT EMITTING LAYERS IN A SEMICONDUCTOR DEVICE

(75) Inventors: Shunpei Yamazaki, Tokyo (JP); Kunitaka Yamamoto, Kanagawa (JP); Masaaki Hiroki, Kanagawa (JP); Takeshi Fukunaga, Kanagawa (JP)

(73) Assignee: Semiconductor Energy Laboratory Co., Ltd., (JP)

( * ) Notice: Subject to any disclaimer, the term of this patent is extended or adjusted under 35 U.S.C. 154(b) by 54 days.

(21) Appl. No.: 10/420,383

(22) Filed: Apr. 22, 2003

(65) Prior Publication Data

US 2003/0196597 A1 Oct. 23, 2003

Related U.S. Application Data

(62) Division of application No. 09/685,912, filed on Oct. 10, 2000, now abandoned.

(30) Foreign Application Priority Data

Oct. 13, 1999 (JP) ................................. 11-291685

(51) Int. Cl.
  H01L 21/00 (2006.01)
  H01L 51/40 (2006.01)
(52) U.S. Cl. .......................... 438/35; 438/99
(58) Field of Classification Search ................. 438/29, 438/30, 34, 35, 151, 99
  See application file for complete search history.

(56) References Cited

U.S. PATENT DOCUMENTS

| 3,484,793 | A | 12/1969 | Weigl ........................... 346/75 |
|---|---|---|---|
| 3,878,517 | A | 4/1975 | Kasubuchi et al. ........... 346/75 |
| 4,067,020 | A | 1/1978 | Arway .......................... 346/75 |
| 4,281,332 | A | 7/1981 | Horike ......................... 346/75 |
| 4,737,803 | A | 4/1988 | Fujimura et al. ............ 346/140 |
| 4,788,629 | A | 11/1988 | Handy et al. |
| 4,882,518 | A | 11/1989 | Cherry |
| 4,951,064 | A | 8/1990 | Kun et al. |
| 4,994,540 | A | 2/1991 | Boerner et al. |
| 4,999,229 | A | 3/1991 | Moritani et al. |
| 5,059,148 | A | 10/1991 | McKenna et al. |
| 5,247,190 | A | 9/1993 | Friend et al. .................. 257/40 |
| 5,278,223 | A | 1/1994 | Gruenewaelder et al. |

(Continued)

FOREIGN PATENT DOCUMENTS

DE 19918193 11/1999

(Continued)

OTHER PUBLICATIONS

Wu, C.C. et al, "Integration of Organic LED's and Amorphous Si TFT's Onto Unbreakable Metal Foil Substrates," International Electron Devices Meeting, San Francisco, CA, Dec. 8-11, 1996, IDEM 1996 Technical Digest, pp. 957-959, (1996).

(Continued)

*Primary Examiner*—Evan Pert
(74) *Attorney, Agent, or Firm*—Cook, Alex, McFarron, Manzo, Cummings & Mehler, Ltd.

(57) ABSTRACT

There is provided a method for precisely forming light emitting layers in a semiconductor device without a positional deviation and at a high throughput. A pixel portion is divided into a plurality of signal lines by banks, and a coating liquid (R), a coating liquid (G), and a coating liquid (B) are applied respectively in a stripe shape at the same time using a dispenser. Then, luminescent layers emitting lights of respective colors of red, green and blue can be formed by heating these coating liquids.

21 Claims, 7 Drawing Sheets

U.S. PATENT DOCUMENTS

| | | | |
|---|---|---|---|
| 5,304,419 A | 4/1994 | Shores | |
| 5,334,539 A | 8/1994 | Shinar et al. | |
| 5,399,502 A | 3/1995 | Friend et al. | |
| 5,643,826 A | 7/1997 | Ohtani et al. | |
| 5,663,573 A | 9/1997 | Epstein et al. | |
| 5,684,365 A | 11/1997 | Tang et al. | 315/169.3 |
| 5,714,195 A | 2/1998 | Shiba et al. | 427/140 |
| 5,757,396 A | 5/1998 | Bruner | 347/27 |
| 5,770,892 A | 6/1998 | Chan et al. | |
| 5,817,366 A | 10/1998 | Arai et al. | 427/66 |
| 5,821,003 A | 10/1998 | Uemura et al. | 428/690 |
| 5,839,456 A | 11/1998 | Han | 134/104.1 |
| 5,882,761 A | 3/1999 | Kawami et al. | 428/69 |
| 5,923,962 A | 7/1999 | Ohtani et al. | 438/150 |
| 5,928,794 A | 7/1999 | Kalinowski et al. | |
| 5,962,962 A | 10/1999 | Fujita et al. | 313/412 |
| 5,972,419 A | 10/1999 | Roitman | |
| 5,985,356 A | 11/1999 | Schultz et al. | 427/8 |
| 6,013,982 A | 1/2000 | Thompson et al. | 313/506 |
| 6,057,647 A | 5/2000 | Kurosawa et al. | 315/169.3 |
| 6,087,771 A | 7/2000 | Roitman | 313/503 |
| 6,134,020 A | 10/2000 | Masumoto et al. | 358/1.16 |
| 6,220,912 B1 | 4/2001 | Shigeoka et al. | 445/24 |
| 6,251,712 B1 | 6/2001 | Tanaka et al. | 438/143 |
| 6,274,887 B1 | 8/2001 | Yamazaki et al. | |
| 6,277,679 B1 | 8/2001 | Ohtani | 438/151 |
| 6,365,917 B1 | 4/2002 | Yamazaki | 257/72 |
| 6,373,453 B1* | 4/2002 | Yudasaka | 345/76 |
| 6,380,007 B1 | 4/2002 | Koyama | 438/151 |
| 6,394,578 B1 | 5/2002 | Akahira et al. | 347/43 |
| 6,424,326 B1 | 7/2002 | Yamazaki et al. | 345/77 |
| 6,440,877 B1 | 8/2002 | Yamazaki et al. | 438/780 |
| 6,506,635 B1 | 1/2003 | Yamazaki et al. | 438/148 |
| 6,531,713 B1 | 3/2003 | Yamazaki | 257/59 |
| 6,545,359 B1 | 4/2003 | Ohtani et al. | 257/758 |
| 6,548,960 B1 | 4/2003 | Inukai | 315/169.3 |
| 6,583,776 B1 | 6/2003 | Yamazaki et al. | 345/77 |
| 6,585,910 B1 | 7/2003 | Kikuyama et al. | 252/79.3 |
| 6,611,108 B1 | 8/2003 | Kimura | 315/169.3 |
| 6,674,136 B1 | 1/2004 | Ohtani | 257/408 |
| 6,690,033 B1 | 2/2004 | Yamazaki et al. | 257/72 |
| 6,696,105 B1 | 2/2004 | Hiroki et al. | 427/466 |
| 6,699,739 B1 | 3/2004 | Yamazaki et al. | 438/156 |
| 6,702,407 B1 | 3/2004 | Azami | 305/204 |
| 6,714,178 B1 | 3/2004 | Koyama et al. | 345/76 |
| 6,747,638 B1 | 6/2004 | Yamazaki et al. | 345/207 |
| 6,750,835 B1 | 6/2004 | Azami | 345/89 |
| 6,756,740 B1 | 6/2004 | Inukai | 315/169.3 |
| 6,759,678 B1 | 7/2004 | Yamazaki et al. | 257/59 |
| 6,776,844 B1* | 8/2004 | Yonekura et al. | 118/621 |
| 6,781,746 B1 | 8/2004 | Yamazaki et al. | 359/321 |
| 6,784,037 B1 | 8/2004 | Yamazaki et al. | 438/199 |
| 6,797,980 B1 | 9/2004 | Takiguchi et al. | 257/40 |
| 6,830,494 B1 | 12/2004 | Yamazaki et al. | 445/24 |
| 2001/0001050 A1 | 5/2001 | Miyashita et al. | 428/690 |
| 2001/0023661 A1 | 9/2001 | Hiroki et al. | 118/300 |
| 2002/0009536 A1 | 1/2002 | Iguchi et al. | 427/10 |
| 2002/0041926 A1 | 4/2002 | Miyashita et al. | 427/66 |
| 2002/0075422 A1* | 6/2002 | Kimura et al. | 349/43 |
| 2002/0197394 A1 | 12/2002 | Yamazaki et al. | 427/66 |
| 2003/0003231 A1 | 1/2003 | Kiguchi et al. | |
| 2003/0196597 A1 | 10/2003 | Yamazaki et al. | |
| 2004/0048001 A1 | 3/2004 | Kiguchi et al. | |
| 2005/0012445 A1 | 1/2005 | Yamazaki et al. | 313/500 |
| 2005/0035708 A1 | 2/2005 | Yamazaki et al. | 313/505 |

FOREIGN PATENT DOCUMENTS

| | | |
|---|---|---|
| EP | 0 347 058 A2 | 12/1989 |
| EP | 0 683 406 | 11/1995 |
| EP | 0 717 446 | 6/1996 |
| EP | 0 756 932 | 2/1997 |
| EP | 0 776 147 | 5/1997 |
| EP | 0 781 075 | 6/1997 |
| EP | 0 859 539 | 8/1998 |
| EP | 0 862 156 | 9/1998 |
| EP | 0 880 303 | 11/1998 |
| EP | 0 883 191 | 12/1998 |
| EP | 0 892 028 | 1/1999 |
| EP | 0 903 778 | 3/1999 |
| EP | 0 930 641 | 7/1999 |
| EP | 0 940 796 | 9/1999 |
| EP | 0 999 595 | 5/2000 |
| EP | 1 093 156 | 4/2001 |
| EP | 1 093 166 | 4/2001 |
| EP | 1 093 167 | 4/2001 |
| EP | 1 122 801 | 8/2001 |
| GB | 2 336 553 | 10/1999 |
| JP | 62-090260 | 4/1987 |
| JP | 07-130652 | 5/1995 |
| JP | 08-078159 | 3/1996 |
| JP | 08-085203 | 4/1996 |
| JP | 08-234683 | 9/1996 |
| JP | 08-330602 | 12/1996 |
| JP | 09-148066 | 6/1997 |
| JP | 09-194831 | 7/1997 |
| JP | 10-012377 | 1/1998 |
| JP | 10-060331 | 3/1998 |
| JP | 10-092576 | 4/1998 |
| JP | 10-153967 | 6/1998 |
| JP | 10-189292 | 7/1998 |
| JP | 10-189525 | 7/1998 |
| JP | 10-270363 | 10/1998 |
| JP | 11-016679 | 1/1999 |
| JP | 11-025852 | 1/1999 |
| JP | 11-054270 | 2/1999 |
| JP | 11-054272 | 2/1999 |
| JP | 11-268296 | 10/1999 |
| JP | 2000-340798 | 12/2000 |
| WO | WO 90/13148 | 11/1990 |
| WO | WO 98/24271 | 6/1998 |
| WO | WO 98/27579 | 6/1998 |
| WO | WO99/10861 * | 3/1999 |
| WO | WO 99/21233 | 4/1999 |

OTHER PUBLICATIONS

Shim, H. et al, "Electrical and Optical Polymer Systems," Donald L. Wise, ed., p. 938, (1998).

U.S. Appl. No. 09/685,698, filed Oct. 10, 2000, Yamazaki et al. including specification, claims, abstract, drawings and PTO filing receipt.

European Search Report re application No. EP 00122446.8, dated Jun. 26, 2001.

Hart, J.A. et al, "A History of Electroluminescent Displays," Indiana University, pp. 1-18, www.indiana.edu/~hightech/fdp/papers/ELDs.html (2004).

EPO office action communication re application No. EP 00 122 446.8, mailed Nov. 4, 2003.

Schenk, H. et al, "Polymers for Light Emitting Diodes," EURODISPLAY '99 Proceedings of the 19th International Display Research Conference, Sep. 6-9, 1999, Berlin, Germany, pp. 33-37, (1999).

European Search Report re application No. EP 00 12 2446.

U.S. Appl. No. 09/776,472 (pending), Hiroki et al, including specification, claims, abstract, drawings and PTO filing receipt.

European search report re application No. EP 00 12 2446.8, dated Jun. 26, 2001.

European search report re application No. EP 00 11 3577.1, dated Mar. 1, 2004.

European search report re application No. EP 01 10 2402.3, dated Apr. 25, 2005.

\* cited by examiner

METHOD FOR PRECISELY FORMING LIGHT EMITTING LAYERS IN A SEMICONDUCTOR DEVICE

This application is a divisional of U.S. application Ser. No. 09/685,912, filed on Oct. 10, 2000 now abandoned.

BACKGROUND OF THE INVENTION

1. Field of the Invention

The present invention relates to a thin film forming apparatus used for fabricating an EL element having a structure in which a luminescent material capable of generating EL (Electro Luminescence), particularly, a luminescent organic material (hereinafter referred to as organic EL material) is placed between an anode and a cathode.

2. Description of the Related Art

In recent years, a display device which uses an EL element as a self-luminous element using an EL phenomenon of an organic EL material (EL display device) has been developed. Since the EL display device is of a self-luminous type, a backlight as in a liquid crystal display device is not necessary. Further, since an angle of visibility is wide, the EL display device is regarded as promising as a display portion of a portable equipment used outdoors.

There are two kinds of EL display devices, that is, a passive type (simple matrix type) and an active type (active matrix type), and both types have been vigorously developed. Particularly, at present, the active matrix type EL display device has attracted a great deal of attention. With respect to the organic EL material which becomes a luminescent layer and can be regarded as the center of the EL element, although research has been made on a low molecular organic EL material and a high molecular organic EL material, attention has been paid to the high molecular organic EL material easier to handle and higher in heat resistance than the low molecular organic EL material.

As a film forming method of the high molecular organic EL material, an ink-jet method proposed by Seiko Epson Corporation has been regarded as promising. With respect to this technique. Japanese Patent Application Laid-open No. Hei. 10-12377. No. Hei. 10-153967 or No. Hei. 11-54270 may be referred to.

However, in the ink-jet method, since the high molecular EL material is jetted and is scattered, if a distance between a coated surface and a nozzle of a head for ink jet is not made suitable, there can occur a problem of a so-called flying curve in which a droplet falls to a portion other than a necessary portion. The flying curve is disclosed in detail in Japanese Patent Application Laid-open No. Hei. 11-54270, and it is specified that a deviation of 50 µm or more from an objective position can occur.

SUMMARY OF THE INVENTION

The present invention has been made in view of the above problems, and has an object to provide a method in which a film of an organic EL material made of polymer is formed precisely without a positional deviation and at a high throughput and a thin film forming apparatus which enables such film formation.

Another object of the present invention is to provide an element forming apparatus of a multi-chamber system (also called a cluster tool system) provided with the thin film forming apparatus.

In order to achieve the above objects, the present invention is characterized in that luminescent layers of red, green and blue are formed into a stripe shape by using a thin film forming apparatus like a dispenser. Note that the stripe shape includes a lone and thin rectangular shape with an aspect ratio of 2 or more, and a long and thin elliptical shape with a ratio of a major axis to a minor axis of 2 or more.

A thin film forming apparatus of the present invention is shown in FIGS. 1A and 1B. FIG. 1A is a view showing the external appearance of the thin film forming apparatus of the present invention seen from the side, and FIG. 1B is a view showing the external appearance seen from the front. In FIG. 1A, reference numeral 100 designates a support base; and 101, a transport stage on which a substrate 102 is fixed. The transport stage 101 can move in an X-direction (horizontal direction) or a Y-direction (vertical direction).

A support pole 103 and a holder 104 are attached to the support base 100, and a coating unit 105 is placed over the transport stage 101. The coating unit 105 is a device provided with a mechanism for coating a solution containing an organic EL material onto a substrate, and is a device for sending a compressed gas (pressurized inert gas) to a head portion 106 and for supplying a solution containing an organic EL material.

Further, the coating unit 105 includes a suck back mechanism (mechanism provided with a suck back valve or air operation valve). The suck back mechanism is a mechanism for drawing a droplet gathered in a nozzle port of a pipe or the like into a nozzle by lowering the pressure in the pipe by using a volume change with a diaphragm gauge or the like.

In the thin film forming apparatus of FIGS. 1A and 1B, the head portion 106 is fixed, and the transport stage 101 on which the substrate 102 is put is moved in the X-direction or Y-direction. That is, such a mechanism is adopted that the transport stage is moved so that the head portion 106 is relatively moved over the substrate 102. Of course, although it is also possible to make such a mechanism that the head portion 106 is moved, the stability is superior when the substrate side is moved.

In the thin film forming apparatus of the above structure, the head portion 106 provided with a nozzle of a supply port of an organic EL material (strictly speaking, a mixture of a solvent and an organic EL material dissolved therein) moves over the substrate 102, so that predetermined portions of the substrate are coated with the organic EL material. Here, a process of coating the organic EL material by the head portion 106 will be described below.

FIG. 2A is a view schematically showing a state where a film of an organic EL material comprising π conjugate system polymer is formed by carrying out the present invention. In FIG. 2A, reference numeral 110 designates a substrate, and a pixel portion 111, a source side driving circuit 112, a gate side driving circuit 113 are formed of TFTs on the substrate 110. A region surrounded by a plurality of source wiring lines connected to the source side driving circuit 112 and a plurality of gate wiring lines connected to the gate side driving circuit 113 is a pixel, and a TFT and an EL element electrically connected to the TFT are formed in the pixel. Such pixels are arranged in matrix form in the pixel portion 111.

Here, reference numeral 114a designates a mixture (hereinafter referred to as a coating liquid (R)) of a solvent and an organic EL material emitting red light when a voltage is applied (hereinafter referred to as an organic EL material (R)): 114b, a mixture (hereinafter referred to as a coating liquid (G)) of a solvent and an organic EL material emitting green light when a voltage is applied (hereinafter referred to as an organic EL material (G)); and 114c, a mixture (hereinafter referred to as a coating liquid (B)) of a solvent and an organic EL material emitting blue light when a voltage is applied (hereinafter referred to as an organic EL material (B)).

Note that with respect to the organic EL materials, there are a method in which a polymerized polymer is directly dissolved in a solvent and then applied, and a method in which after a film is formed of a monomer dissolved in a solvent, heating and polymerization is performed to make a polymer. Both methods can be used in the present invention. Here, an example in which an organic EL material of polymer is dissolved in a solvent and then applied will be described.

In the case of the present invention, the coating liquid (R) 114a, the coating liquid (G) 114b, and the coating liquid (B) 114c are separately applied from the head portion 106 of the thin film forming apparatus in the direction of an arrow as shown in FIGS. 1A and 1B. That is, stripe-shaped luminescent layers (strictly speaking, a precursor of a luminescent layer) are formed at the same time on a pixel line to emit red light, a pixel line to emit green light, and a pixel line to emit green light.

Note that the pixel line indicates a line of pixels separated by a bank 121, and the bank 121 is formed over the source wiring line. That is, a line on which a plurality of pixels are arranged in series along the source wiring line is called the pixel line. However, here, although the description has been made on the case where the bank 121 is formed over the source wiring line, the bank may be provided over the gate wiring line, and a line on which a plurality of pixels are arranged in series along the gate wiring line is called the pixel line.

Thus, the pixel portion 111 can be regarded as an aggregate of a plurality of pixel lines divided by the stripe-shaped banks provided over the plurality of source wiring lines or the plurality of gate wiring lines. From such a viewpoint, it can be said that the pixel portion 111 comprises a pixel line in which a stripe-shaped luminescent layer emitting red light is formed, a pixel line in which a stripe-shaped luminescent layer emitting green light is formed, and a pixel line in which a stripe-shaped luminescent layer emitting blue light is formed.

Since the stripe-shaped banks are provided over the plurality of source wiring lines or the plurality of gate wiring lines, it is also possible to substantially regard the pixel portion 111 as an aggregate of a plurality of pixel lines divided by the plurality of source wiring lines or the plurality of gate wiring lines.

Next, the state of the head portion (also called a coating portion) 107 shown in FIG. 2A is enlarged as shown in FIG. 2B.

Reference numeral 107 designates the head portion of the thin film forming apparatus, and a nozzle 116a for red, a nozzle 116b for green, and a nozzle 116c for blue are attached thereto. Besides, a coating liquid (R) 114a, a coating liquid (G) 114b, and a coating liquid (B) 114c are respectively stored in the inside of each of the nozzles. These coating liquids are pressurized by a compressed gas filled in a pipe 117 and are pushed out onto the pixel portion 111. The head portion 107 like this is moved toward this side along the direction perpendicular to the paper plane, so that the coating step as shown in FIG. 2A is carried out.

FIG. 2C is an enlarged view of the vicinity of a coating portion designated by 118. The pixel portion 111 on the substrate 110 is an aggregate of a plurality of pixels made of a plurality of TFTs 119a to 119c and pixel electrodes 120a to 120c. When pressure is applied to the nozzles 116a to 116c of FIG. 2B by the compressed gas, the coating liquids 114a to 114c are pushed out by the pressure.

Note that the bank 121 made of a resin material is provided between pixels, and prevents the coating liquids from being mixed between adjacent pixels. In this structure, when the width (determined by the resolution of photolithography) of the bank 121 is made narrow, the integration of the pixel portion is improved and an image of high fineness can be obtained. Particularly, in the case where the viscosity of the coating liquid is 1 to 30 cp, it is effective.

However, if the viscosity of the coating liquid is 30 cp or more, or is in a sol or gel state, it is also possible not to use the bank. That is, if a contact angle between a coating liquid and a coated surface is sufficiently large after coating, the coating liquid does not spread excessively, so that it becomes unnecessary to dam it by the bank. In that case, the luminescent layer is finally formed in an elliptical shape (long and thin elliptical shape with a ratio of a major axis to a minor axis of 2 or more), typically a long and thin elliptical shape extending from one end to the other end of the pixel portion.

As the resin material which can form the bank 21, acryl, polyimide, polyamide, or polyimidoamide can be used. If carbon, black pigment or the like is previously provided in this resin material to blacken the resin material, it becomes also possible to use the bank 121 as a light shielding film between pixels.

If a sensor using light reflection is attached to the vicinity of the tip end of any one of the nozzles 116a, 116b and 116c, it is also possible to make such an adjustment that the distance between a coated surface and the nozzle is always kept constant. Further, by providing a mechanism to adjust the distance between the nozzles 116a to 116c in accordance with a pixel pitch (distance between pixels), it is possible to cope with an EL display device of any pixel pitch.

In this way, the coating liquids 114a to 114c applied from the nozzles 116a to 116c cover the pixel electrodes 120a to 120c, respectively. Note that the operation of the head portion 107 as described above is controlled by electrical signals.

After the coating liquids 114a to 114c are applied, a heating treatment (baking treatment or firing treatment) is performed in vacuum, so that the organic solvents contained in the coating liquids 114a to 114c are volatilized and the luminescent layers comprising the organic EL materials are formed. For that purpose, the organic solvent which volatilizes at a temperature lower than the glass transition temperature (Tg) of the organic EL material is used. The thickness of the finally formed luminescent layer is determined by the viscosity of the organic EL material. In this case, the viscosity can be adjusted by selecting the organic solvent or additives, and it is preferable that the viscosity is made 1 to 50 cp (preferably 5 to 20 cp).

Further, if a large number of impurities which can become crystal nuclei exist in the organic EL material, a possibility that the organic EL material is crystallized when the organic solvent is volatilized, becomes high. If it is crystallized, luminescent efficiency is lowered, which is not preferable. Thus, it is desirable that impurities are not contained in the organic EL material as much as possible.

In order to lower the impurity, it is important that the solvent and the organic EL material are thoroughly refined, and the environment when the solvent and the organic EL material are mixed is made as clean as possible. As refining of the solvent or refining of the organic EL material, it is preferable to repeatedly carry out a technique such as a distillation method, sublimation method, filtration method, recrystallization method, reprecipitation method, chromatography method, or dialysis method. Finally, it is desirable to reduce impurities such as metal elements or alkaline metal elements to 0.1 ppm or less (preferably 0.01 ppm or less).

Besides, it is also preferable to sufficiently take care of an atmosphere when the coating liquid containing the organic EL material is applied using the thin film forming apparatus as shown in FIGS. 1A and 1B. Specifically, it is desirable that the film formation step of the organic EL material is carried out in a clean booth or a glove box filled with an inert gas such as nitrogen.

By using the thin film forming apparatus as described above, three kinds of luminescent layers emitting lights of the respective colors of red, green and blue can be formed at the same time, so that the luminescent layers comprising the high molecular organic EL materials can be formed at a high throughput. Further, different from the ink-jet system, since it is possible to make coating in a stripe shape without a gap in one pixel line, the throughput is extremely high.

DETAILED DESCRIPTION OF THE PREFERRED EMBODIMENTS

Figure 2A:
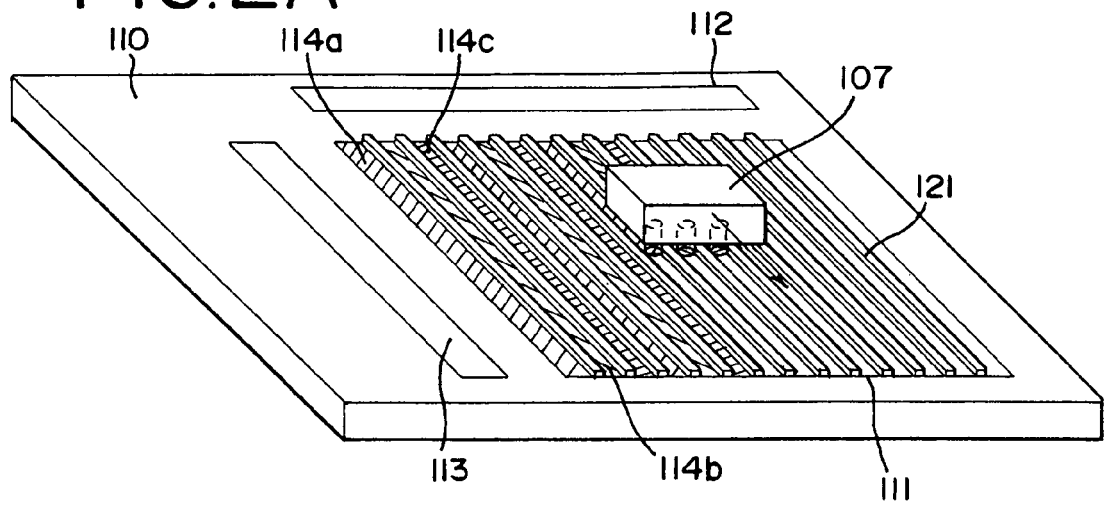
FIGS. 2A to 2C are views showing a coating step of an organic EL material.

In the following, an embodiment mode of the invention will be described. As shown in FIG. 2A, when the pixel portion 111, the source side driving circuit 112, the gate side driving circuit 113 comprises TFTs on the substrate 110, the stripe-shaped banks 121 are formed along the source wiring lines (wiring lines connecting the source side driving circuit 112 to the pixel portion 111 and transmitting information signal to the switching TFT of the pixel portion).

Next, the coating liquid (R) 114a, the coating liquid (G) 114b, and the coating liquid (B) 114c, which is to become luminescent layers, are prepared. Each of the coating liquids 114a to 114c is mainly formed by dissolving a high molecular organic EL material in a solvent. As a typical high molecular organic EL material, polyparaphenylene vinylene (PPV) system, polyvinylcarbazole (PVK) system, polyfluorene system or the like can be cited.

Although various types exist as the PPV system organic EL materials, for example, molecular formulas [Compound 1] and [Compound 2] as indicated in the attached sheet have been announced. (H. Shenk, H. Becker, O. Gelsen. E. Kluge. W. Kreuder, and H. Spreitzer, "Polymers for Light Emitting Diodes", Euro Display, Proceedings, 1999, p. 33–37)

It is also possible to use polyphenylvinyl disclosed in Japanese Patent Application Laid-open No. Hei. 10-92576. The molecular formulas are shown as [Compound 3] and [Compound 4] in the attached sheet:

As the PVK system organic EL material, there is a molecular formula as [Compound 5] in the attached sheet:

The high molecular organic EL material can be applied after the material in a polymer state is dissolved in a solvent, or can be polymerized after the material is dissolved in a solvent and coating in a monomer state. In the case where the material is applied in the monomer state, a polymer precursor is first formed, and is polymerized by heating in vacuum to form the polymer.

Specifically, cyanopolyphenylenevinylene may be used for the coating liquid (R) 114c, polyphenylenevinylene may be used for the coating liquid (G) 114b, and polyphenylenevinylene or polyalkylphenylene may be used for the coating liquid (B) 114c. As the solvent, chloroform, dichloromethane, γ-butyllactone, butyl cellosolve, or NMP (N-methyl-2-pyrrolidone) may be used. It is also effective to add an additive to raise the viscosity of the coating liquid.

However, the above examples are merely examples of the organic EL materials which can be used for the luminescent layer of the present invention, and the invention is not limited to these. In the present invention, the mixture of the organic EL material and the solvent is applied by the thin film forming apparatus shown in FIGS. 1A and 1B, and the solvent is volatilized and removed by a heating treatment, so that the luminescent layer is formed. Thus, any organic EL material may be used, when the solvent is volatilized, if the temperature does not exceed the glass transition temperature of the luminescent layer.

Figure 1A:
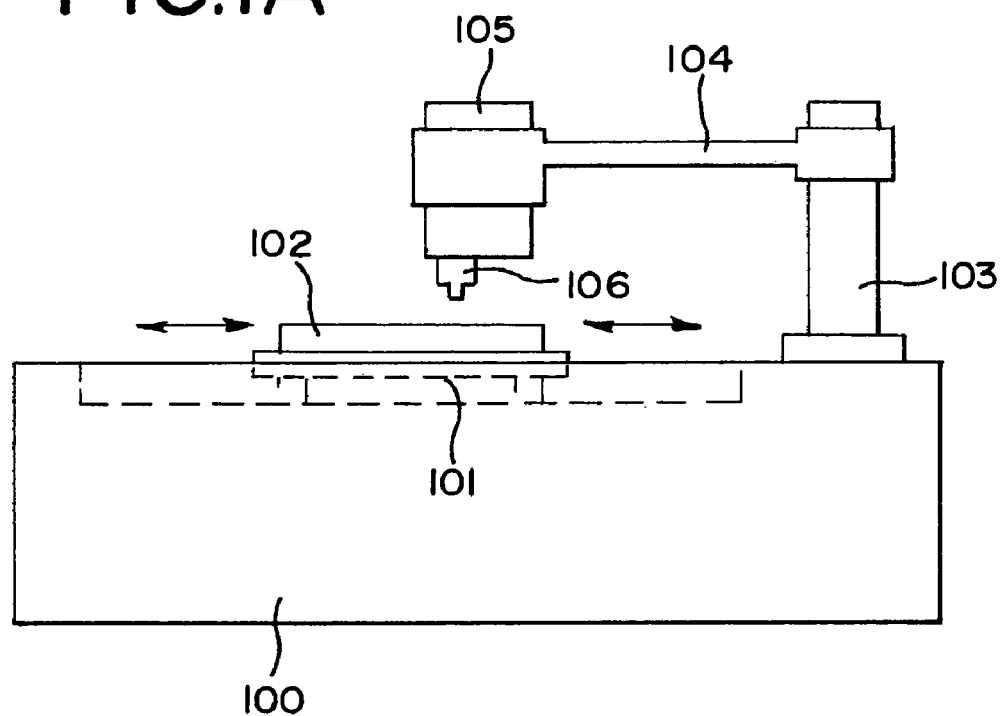
FIGS. 1A and 1B are views showing a thin film forming apparatus.
Figure 1B:
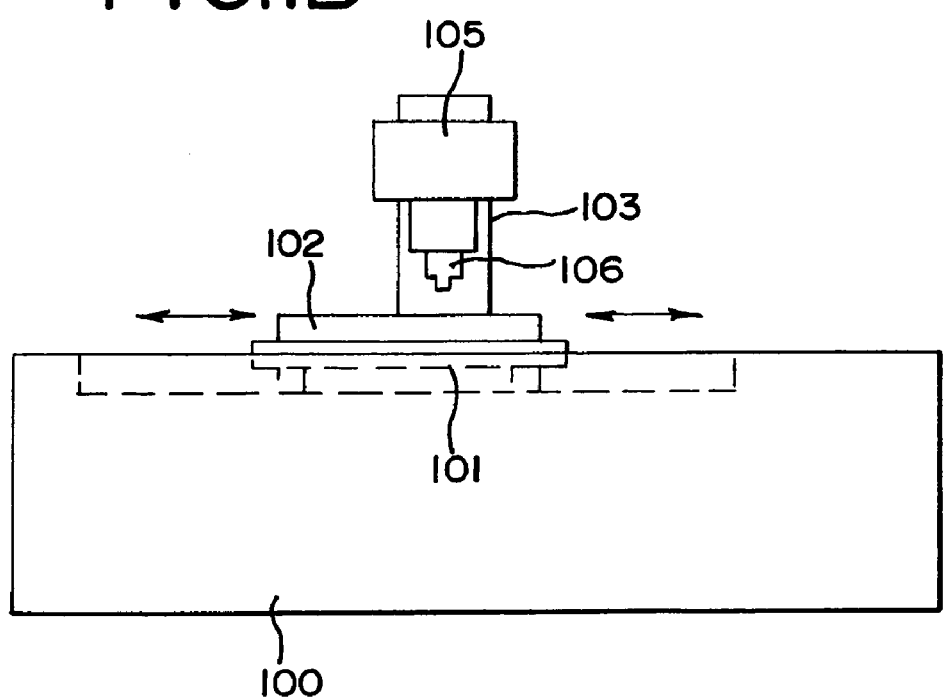

Further, when a coating step is carried out using the thin film forming apparatus of FIGS. 1A and 1B, it is desirable that a treatment atmosphere is made a dry atmosphere with the least possible moisture and the step is carried out in an inert gas. Since the EL layer is easily deteriorated by the existence of moisture or oxygen, it is necessary to remove such a factor to the utmost when the EL layer is formed. For example, a dry nitrogen atmosphere, a dry argon atmosphere, or the like is preferable. For that purpose, it is preferable that the thin film forming apparatus of FIGS. 1A and 1B is installed in a clean booth filled with an inert gas, and the coating step is carried out in the atmosphere.

[Embodiment 1]

In the mode of carrying out the invention, the description has been made on the example in which three kinds of stripe-shaped luminescent layers emitting lights of red, green and blue are formed in the vertical or horizontal direction at the same time. In this embodiment, a description will be made on an example in which a stripe-shaped luminescent layer is divided into plural portions in the longitudinal direction and is formed.

Figure 3A:
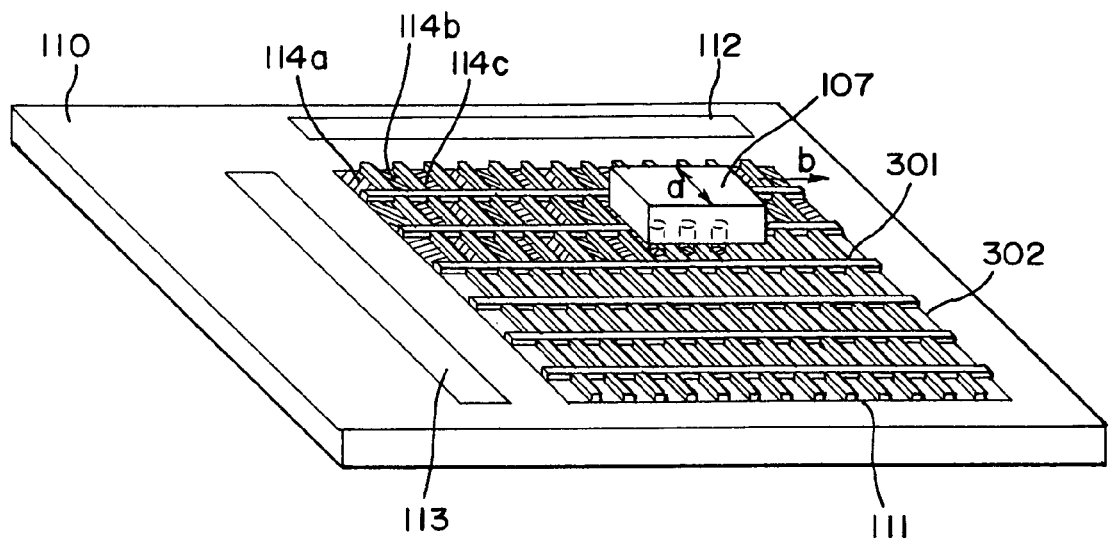
FIGS. 3A and 3B are views showing a coating step of an organic EL material.
Figure 3B:
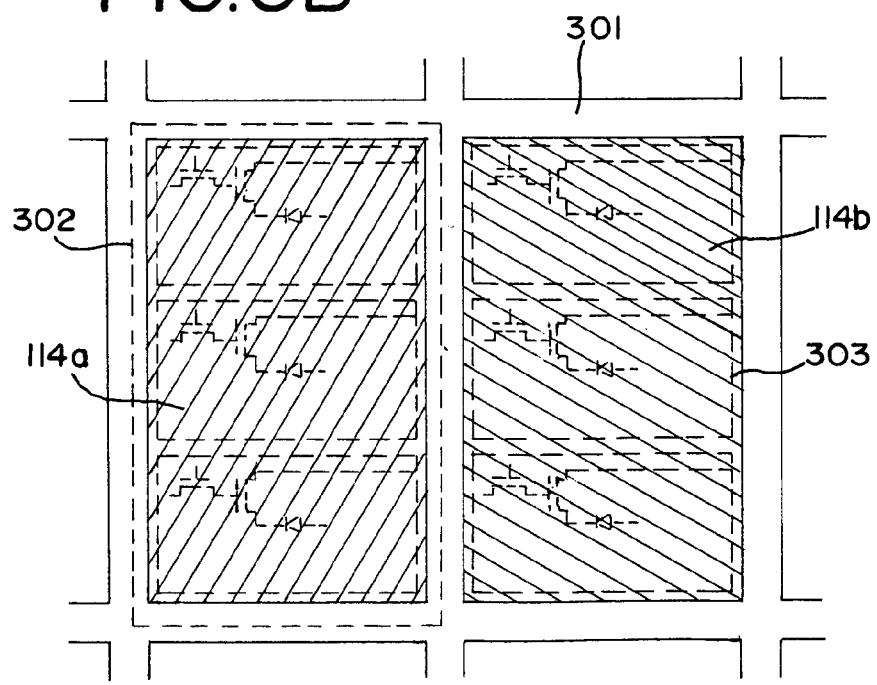

As shown in FIG. 3A, a pixel portion 111, a source side driving circuit 112, and a gate side driving circuit 113 comprises TFTs on a substrate 110, and the pixel portion 111 is divided into matrix form by banks 301. In the case of this embodiment, in one square 302 separated by the banks 301, as shown in FIG. 3B, a plurality of pixels 303 are disposed. The number of pixels is not limited.

In such a state, a film formation step of an organic EL material functioning as a luminescent layer is carried out by using the thin film forming apparatus of the present invention. In this case as well, a coating liquid 114a for red, a coating liquid 114b for green, and a coating liquid 114c for blue are selectively applied using the head portion 107.

The feature of this embodiment is that it is possible to selectively coat the respective squares 302 with the coating liquids 114*a* to 114*c*. That is, in the system explained in the mode of carrying out the invention, it is only possible to selectively coat with the coating liquid of each color of red, green and blue in a stripe shape. On the other hand, in this embodiment, the arrangement of color is tree for each square. Thus, as shown in FIG. 3A, it is also possible to adopt such an arrangement that the color of a coating liquid applied on an arbitrary square is shifted for every row (or column).

It is also possible to provide one pixel in the square 302, and in that case, it is also possible to make a pixel structure (pixel structure in which pixels respectively corresponding to RGB are arranged to always form a triangle) which is generally called a delta arrangement.

The operation given to the head portion 107 for carrying out this embodiment is as follows: First, the head portion 107 is moved in the direction of an arrow "a" so that the inside portions of three squares (respective squares corresponding to red, green and blue) are completely immersed in the coating liquids. When it is ended, the head portion 107 is moved in the direction of an arrow "b" so that the coating liquids are applied on the next three squares. This operation is repeated to coat the pixel portion with the coating liquids, and thereafter, the solvent is volatilized by a heat treatment to form the organic EL material.

In the conventional inkjet method, since a droplet is applied, the organic EL material is formed in circle shape on the surface. Thus, it is difficult to coat the entire of a long and thin pixel. Particularly, in the case where the whole pixel functions as a luminescent region, it is necessary to coat the organic EL material on the whole pixel. In that point, this embodiment has such a merit that the inside of the square can be completely filled with the coating liquid by moving the head portion 107 in the direction of the arrow "a".

[Embodiment 2]

When the direction of the pixel line shown in FIG. 2A is made the vertical direction, the bank 121 is formed along the source wiring line. Thus, it can be said that the pixel line in the case where the bank is formed along the gate wiring line is formed in the horizontal direction. That is, in the case where the pixel line is formed in the vertical direction, the arrangement becomes as shown in FIG. 4A, and in the case where the pixel line is formed in the horizontal direction, the arrangement becomes as shown in FIG. 4B.

Figure 4A:
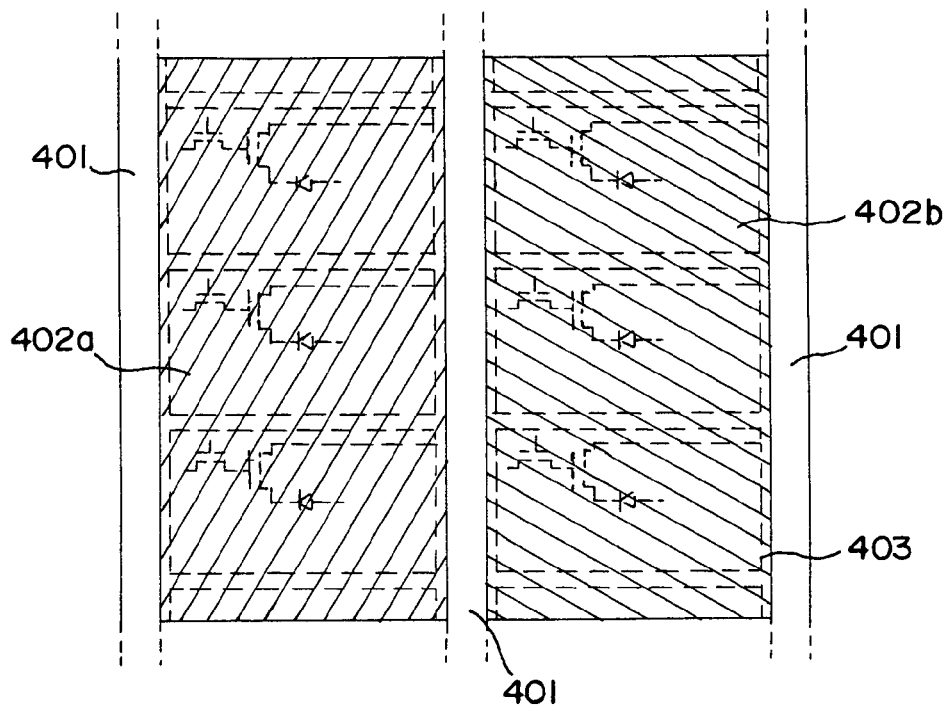
FIGS. 4A and 4B are views respectively showing a coating step of an organic EL material.
Figure 4B:
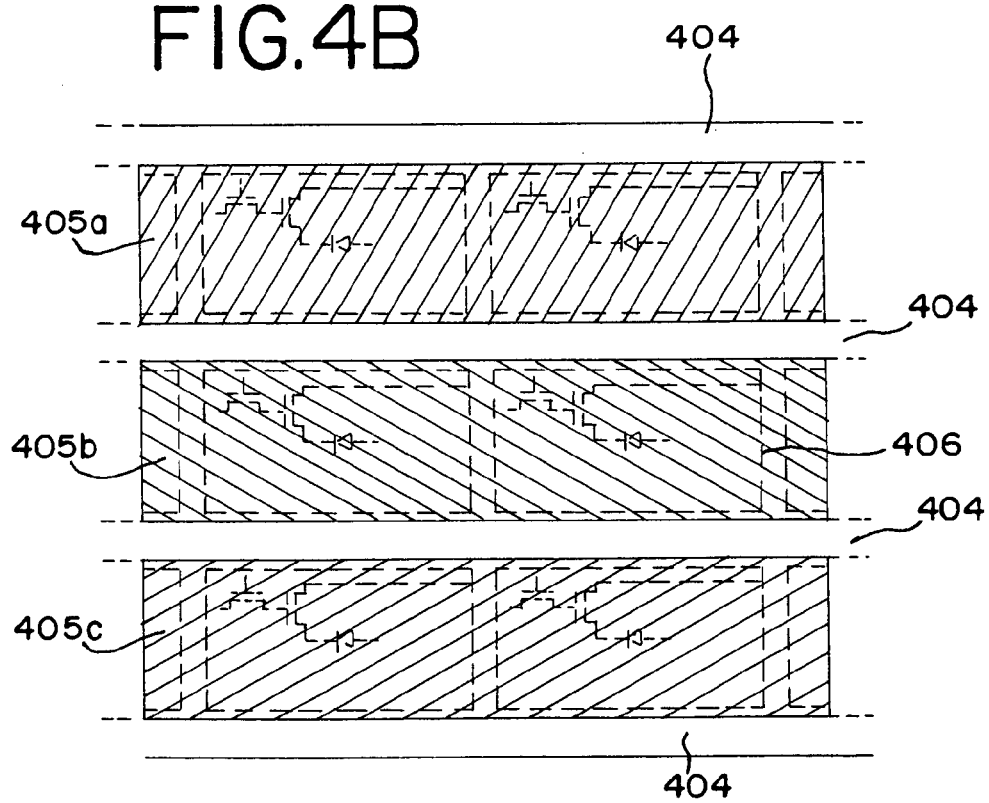

In FIG. 4A, reference numeral 401 designates a bank formed into a stripe shape in the vertical direction: 402*a*, an EL layer emitting red light: and 402*b*, an EL layer emitting green light. Of course, an EL layer (not shown) emitting blue light is formed adjacent to the EL layer 402*b* emitting green light. Note that the bank 401 is formed over the source wiring line through an insulating film and along the source wiring line.

The EL layer here means a layer made of an organic EL material contributing to light emission, such as a luminescent layer, a charge injection layer, or charge transport layer. Although there can be a case of a single layer of a luminescent layer, for example, in the case where a hole injection layer and a luminescent layer are laminated, the laminate film is called the EL layer.

In this case, the head portion 106 shown in FIG. 1B is moved in the vertical direction (Y direction). That is, the three pixel lines of the respective colors of red, green and blue are scanned in the vertical direction at the same time, and the coating liquids are applied on the pixel lines.

In FIG. 4B, reference numeral 404 designates banks formed into stripe shape in the horizontal direction; 405*a*, an EL layer emitting red light; 405*b*, an EL layer emitting green light; and 405*c*, an EL layer emitting blue light. Note that the banks 404 are formed over the gate wiring line through an insulating film along the gate wiring lines.

In this case, the head portion 106 shown in FIG. 1B is moved in the horizontal direction (X direction). That is, the pixel lines of red, green and blue are scanned at the same time in the horizontal direction, and the coating liquids are applied on the pixel lines.

As described above, even if the selective coating with the liquid is made for each pixel line along the vertical direction or each pixel line along the horizontal direction, it can be easily handled by electrically controlling the direction in which the head portion 106 is scanned.

[Embodiment 3]

In this embodiment, a description will be made on an example of a case where the thin film forming apparatus of the present invention is incorporated in a thin film forming apparatus of a multi-chamber system (or also called a cluster tool system), and a forming process of an EL element is continuously carried out without opening to the air.

Figure 5:
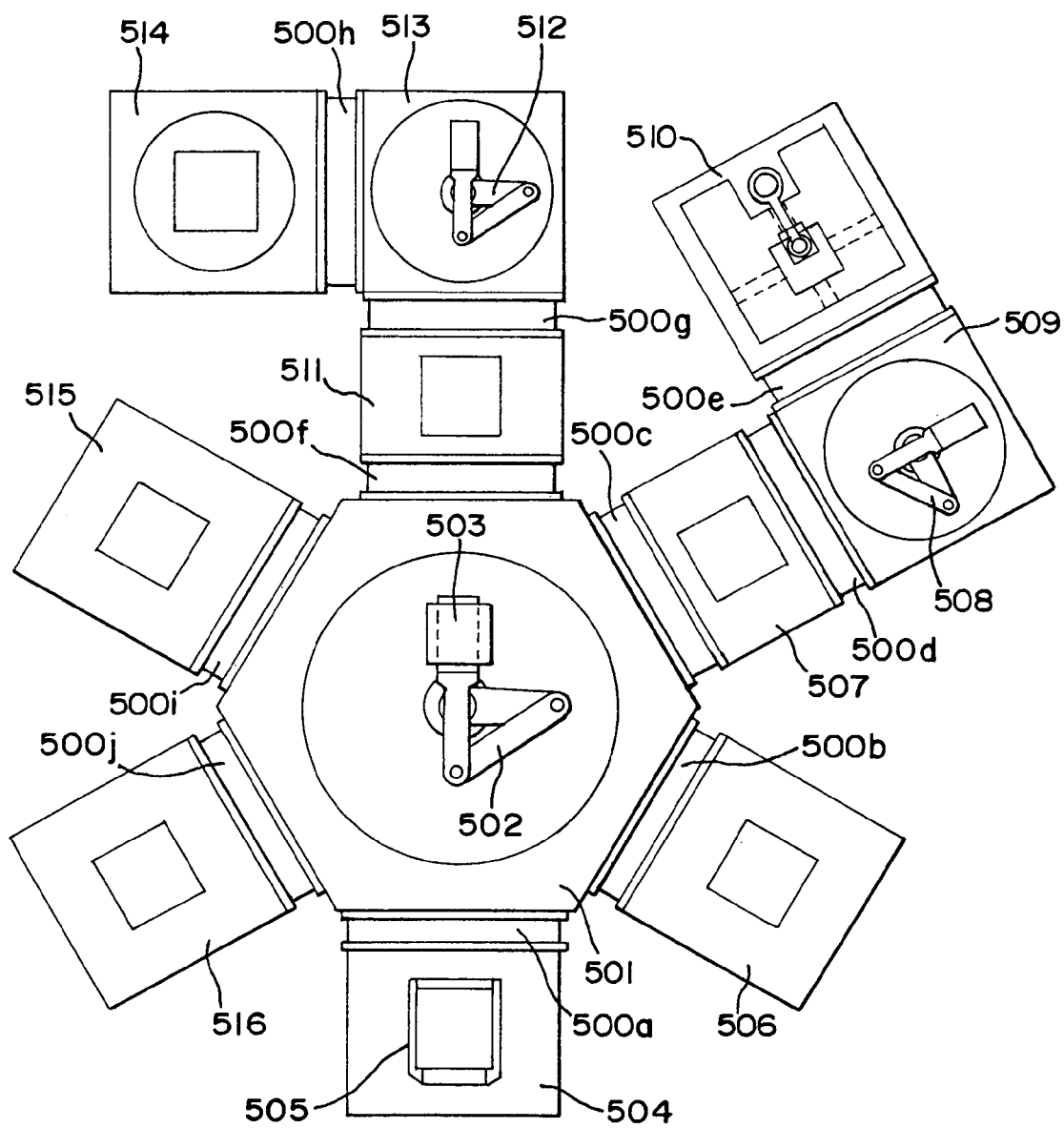
FIG. 5 is a view showing a thin film forming apparatus.

In FIG. 5, reference numeral 501 designates a common chamber, and the common chamber 501 is provided with a transporting mechanism (A) 502 by which a substrate 503 is transported. An atmosphere of the common chamber 501 is made reduced, and the common chamber 501 is shut off from respective treatment chambers by gates. The transfer of the substrate to the respective treatment chambers is carried out by the transporting mechanism (A) 502 when the gate is opened. In order to reduce the pressure of the common chamber 501, although it is possible to use an exhaust pump such as an oil rotation pump, a mechanical booster pump, a turbo molecular pump, or a cryopump, it is preferable to use the cryopump effective to remove moisture.

In the following, the respective chambers will be described. Since the common chamber 501 comes to have the reduced pressure atmosphere, all treatment chambers directly coupled to the common chamber 501 are provided with an exhaust pump (not shown). As the exhaust pump, the foregoing oil rotation pump, mechanical booster pump, turbo molecular pump, or cryopump is used.

First, reference numeral 504 designates a transport chamber (A) in which the substrate is carried in and out, and is called also a load lock chamber. The transport chamber (A) 504 is shut off from the common chamber 501 by a gate 500*a*, and a carrier 505 on which a substrate is set is disposed here. Note that the transport chamber (A) 504 may be divided into one for carrying the substrate in and one for carrying the substrate out.

In this embodiment, the substrate 503 is set on the carrier while an element formation surface is directed downward. This is for facilitating a face down system (also called a depo-up system) when vapor phase film formation (film formation by sputtering or vapor deposition) is performed later. The face down system is such a system that film formation is made while the element formation surface of a substrate is directed downward. According to this system, attachment of dust or the like can be suppressed.

Next, reference numeral 506 designates a treatment chamber (hereinafter referred to as a pre-treatment chamber) for processing the surface of a cathode or anode which becomes a pixel electrode of the EL element. The pre-treatment chamber 506 is shut off from the common chamber 501 by a gate 500*b*. Although the pre-treatment chamber can be variously changed according to the manufacturing process of the EL element, in this embodiment, it is designed such that heating can be made at 100 to 120° C. while the surface of the pixel electrode is irradiated with ultraviolet light. Such pre-treatment is effective when the anode surface of the EL element is processed.

Next, reference numeral 507 designates a firing treatment chamber (A) and is shut off from the common chamber 501 by a gate 500c. Although described later, vacuum exhaustion and purge can be made in the firing treatment chamber (A) 507 which includes a mechanism for inverting the substrate surface. Further, a transport chamber (B) 509 provided with a transporting mechanism (B) 508 is connected to the firing treatment chamber (A) 507 through a gate 500d. Besides, a solution coating treatment chamber (A) 510 is connected to the transport chamber (B) 509 through a gate 500e.

Here, the operation of the firing treatment chamber (A) 507, the transport chamber (B) 509, and the solution coating treatment chamber (A) 510 will be described.

When the substrate is transported to the firing treatment chamber (A) 507, the firing treatment chamber (A) 507 is in a reduced pressure state, and the gate 500d is closed. When the substrate (element formation surface is directed downward) is transported, the gate 500c is closed, and the inside of the firing treatment chamber (A) 507 is returned to the atmospheric pressure by purging the inert gas. The substrate is turned over by the inverting mechanism (not shown) and the element formation surface is directed upward.

In this state, the gates 500d and 500e are opened, and the substrate is transported to the treatment chamber (hereinafter referred to as the solution coating treatment chamber (A)) 510 in which a solution containing an organic EL material is applied. Note that the solution coating treatment chamber (A) 510 is a treatment chamber provided with the same function as the thin film forming apparatus of the present invention shown in FIGS. 1A and 1B, and a mixture of the organic EL material and a solvent, which becomes a luminescent layer of a stripe shape, is applied. It is desirable to make a high purity inert gas atmosphere so that oxygen and moisture are not taken in the organic EL material.

The substrate on which the mixture of the organic EL material and the solvent is applied is again returned to the firing treatment chamber (A) 507, and a heating treatment (firing treatment) is carried out at a temperature of 100 to 120° C. It is desirable that this chamber is also made to have a high purity inert gas atmosphere. When the firing treatment is ended, the substrate is inverted by the inverting mechanism (not shown), and the firing treatment chamber (A) 507 is vacuum exhausted in the state where the element formation surface is again directed downward. Of course, the gates 500c and 500d are closed at this time.

When vacuum exhaustion of the firing treatment chamber (A) 507 is ended, the gate 500c is opened and the substrate is returned to the common chamber 501 by the transporting mechanism (A) 502.

The above is the operation of the firing treatment chamber (A) 507, the transport chamber (B) 509, and the solution coating treatment chamber (A) 510.

Next, reference numeral 511 designates a firing treatment chamber (B) which is shut off from the common chamber 501 by a gate 500f. Note that vacuum exhaustion and purge can be made also in the firing treatment chamber (B) 511 which includes a mechanism for inverting the substrate surface. Further, a transport chamber (C) 513 provided with a transporting mechanism (C) 512 is connected to the firing treatment chamber (B) 511 through a gate 500g. Besides, a solution coating treatment chamber (B) 514 is connected to the transport chamber (C) 513 through a gate 500h.

Since the operation of the firing treatment chamber (B) 511, the transport chamber (C) 513, and the solution coating treatment chamber (B) 514 is almost identical to the operation of the firing treatment chamber (A) 507, the transport chamber (B) 509, and the solution coating treatment chamber (A) 510, only different points will be described here.

The substrate transported into the solution coating treatment chamber (B) 514 is applied with a mixture of an organic EL material and a solvent, which becomes a hole injection layer or hole transport layer, by a spin coating method. The atmosphere is made a high purity inert gas atmosphere so that oxygen and moisture are not taken in the organic EL material, which is similar to the solution coating treatment chamber (A) 510.

When a firing treatment is ended in the firing treatment chamber (B) 511, vacuum exhaustion of the firing treatment chamber (B) 511 is carried out, the gate 500f is opened, and the substrate is returned to the common chamber 501 by the transporting mechanism (A) 502. The above is the operation of the firing treatment chamber (B) 511, the transport chamber (C) 512, and the solution coating treatment chamber (B) 514.

Next, reference numeral 515 designates a treatment chamber (hereinafter referred to as a vapor phase film forming treatment chamber (A)) for forming an insulating film or conductive film (in this embodiment, a conductive film) by a vapor phase film formation method. Although a vapor deposition method or sputtering method can be cited as the vapor phase film formation method, since it is used for the purpose of forming an electrode on the organic EL material, the vapor deposition method which does not easily cause damage is preferable. In any event, it is shut off from the common chamber 501 by a gate 500i, and film formation is made under vacuum. Note that film formation is made by the depo-up system.

In the vapor phase film forming treatment chamber (A) 515, in the case where a vapor deposition treatment is carried out, it is necessary to provide a vapor deposition source. A plurality of vapor deposition sources may be provided and may be changed according to the film to be formed. Besides, a vapor deposition source of a resistance heating system may be adopted, or vapor deposition source of an EB (electron beam) system may be adopted.

Next, reference numeral 516 designates a treatment chamber (hereinafter referred to as a vapor phase film forming treatment chamber (B)) for forming an insulating film or conductive film (in this embodiment, an insulating film) by a vapor phase film formation method. As the vapor phase film formation method, although a plasma CVD method or sputtering method can be cited, it is desirable that an insulating film with the lowest possible film formation temperature can be formed. For example, it is effective that a silicon nitride film is formed by a remote plasma CVD method. In any event, it is shut off from the common chamber 501 by a gate 500j, and film formation is made under vacuum.

Note that the above treatment (exhaustion, transport, film forming treatment, etc.) can be made fully automatic control using a computer by a touch panel and sequencer.

The main feature of the multi-chamber thin film forming apparatus of the above structure is that all film formation means needed to form the EL element are provided and steps up to the formation of a passivation film can be carried out without opening to the air. As a result, it becomes possible to form the EL element proof against deterioration by using a high molecular organic EL material and by simple means, and it becomes possible to manufacture an EL display device with high reliability.

Note that this embodiment can be used as a thin film forming apparatus even when either structure of the embodiments 1 and 2 is carried out.

[Embodiment 4]

In this embodiment, an example in which a part of the multi-chamber thin film forming apparatus shown in FIG. 5 is changed will be described with reference to FIG. 6. Specifically, a structure in which a glove box 521 and a path box 522 are provided in a transport chamber (A) 504. Note that the embodiment 3 can be cited for explanation as to portions other than modification points.

The glove box 521 is connected to the transport chamber (A) 504 through a gate 523. In the glove box 521, a treatment for sealing the EL device in a closed space is performed. This treatment is a treatment for protecting the substrate (substrate which has been processed in the thin film forming apparatus of FIG. 6 and has been returned to the transport chamber (A) 504), which has been subjected to every treatment, from the outer air, and uses, for example, means for mechanically sealing it with a sealing material or sealing it with a thermosetting resin or ultraviolet light hardening resin.

As the sealing material, although a material such as glass, ceramic, or metal can be used, it must be translucent in the case where light is emitted to the side of the sealing material. The sealing material and the substrate which has been subjected to every treatment described above are bonded by using the thermosetting resin or ultraviolet light hardening resin, and the resin is hardened by a heat treatment or ultraviolet light irradiation treatment to form the closed space. It is also effective to provide a drying agent such as barium oxide in this closed space.

It is also possible to fill the space between the sealing material and the substrate on which the EL element is formed with the thermosetting resin or ultraviolet light hardening resin. In this case, it is effective to add a drying agent such as barium oxide in the thermosetting resin or ultraviolet light hardening resin.

The thin film forming apparatus shown in FIG. 6 has such a structure that a mechanism (hereinafter referred to as an ultraviolet light irradiation mechanism) 524 for irradiating ultraviolet light is provided in the inside of the globe box 521, and the ultraviolet light hardening resin is hardened by ultraviolet light emitted from this ultraviolet light irradiation mechanism 524.

Although the operation in the glove box 521 may be a manual operation, it is preferable to make such a structure that the operation is mechanically performed through computer control. In the case where the sealing material is used, it is preferable that a mechanism for coating with a sealing agent (here, thermosetting resin or ultraviolet light hardening resin), as used in a cell assembling step of a liquid crystal, a mechanism for bonding substrates, and a mechanism for hardening the sealing agent are incorporated.

It is also possible to reduce the pressure of the inside of the glove box 521 by attaching an exhaust pump. In the case where the above sealing step is mechanically performed by a robot operation, it is effective to perform the operation under low pressure.

Next, the path box 522 is connected to the glove box 521 through a gate 525. It is also possible to reduce the pressure of the path box 522 by attaching an exhaust pump. The path box 522 is an equipment for preventing the glove box 521 from being directly exposed to the outer air, and a substrate is taken out from here.

As described above, in the thin film forming apparatus of this embodiment, since the substrate is exposed to the outer air at the stage where the EL element has been completely sealed in the closed space, it is possible to almost completely prevent the EL element from being deteriorated by moisture or the like. That is, it becomes possible to manufacture the EL display device with high reliability.

[Embodiment 5]

Although the mode of carrying out the invention or the embodiment 1 shows the example in which all of the luminescent layer emitting red light, the luminescent layer emitting green light, and the luminescent layer emitting blue light are formed by using the thin film forming apparatus shown in FIGS. 1A and 1B, at least one of the luminescent layers for red, green and blue may use the thin film forming apparatus shown in FIG. 1.

Figure 2B:
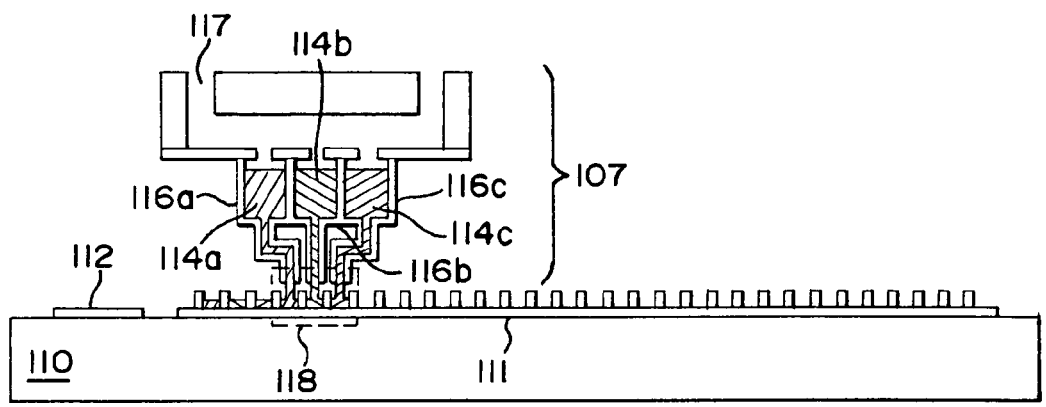

That is, in FIG. 2B, it is also possible to omit the nozzle 116c (nozzle for applying the coating liquid (B) 114c) and to coat with the coating liquid (B) 114c by another means.

Figure 6:
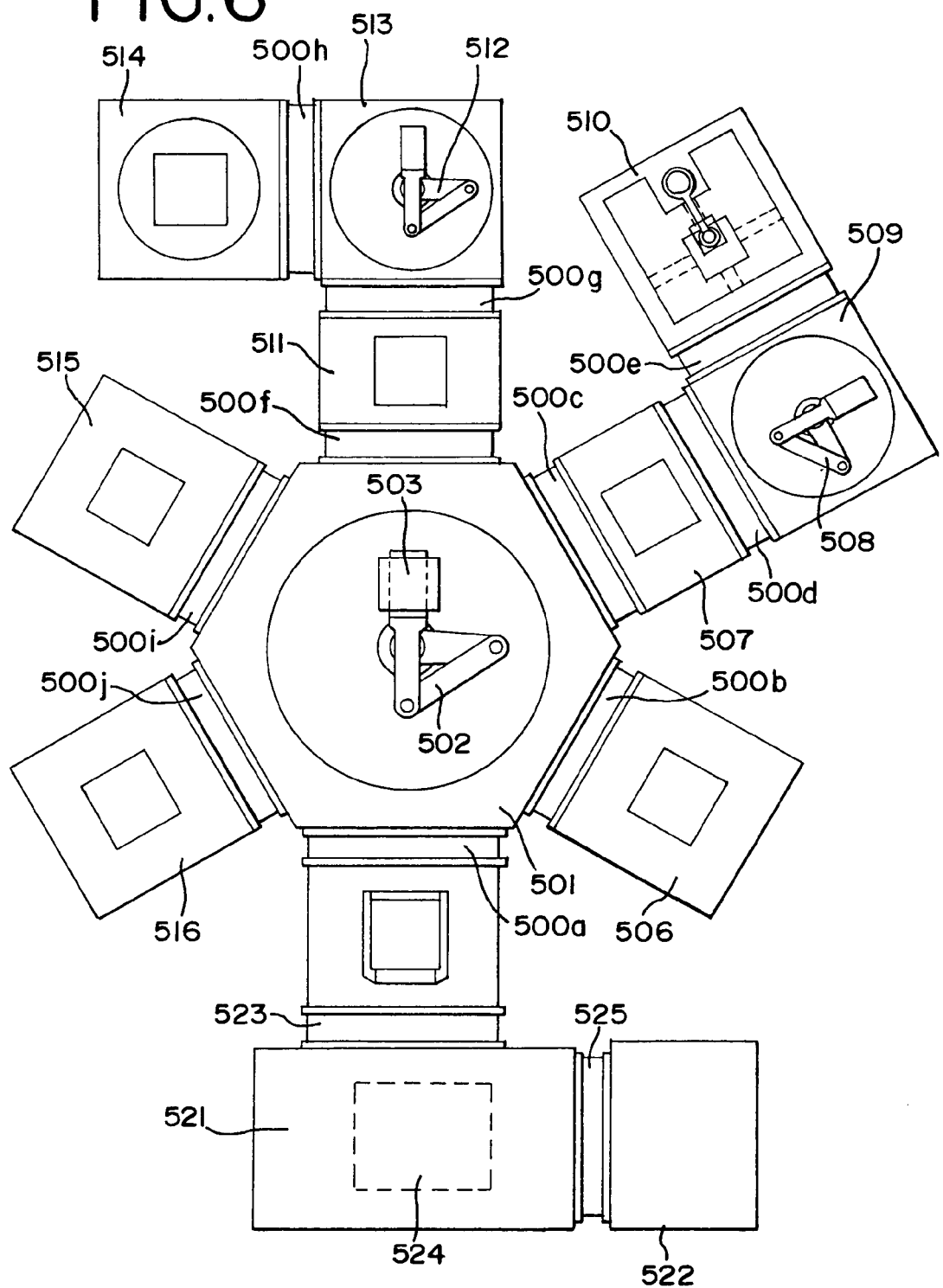
FIG. 6 is a view showing a thin film forming apparatus.

Specifically, in FIGS. 5 and 6, the coating liquid (R) 114a and the coating liquid (G) 114b are applied in the solution coating treatment chamber (A) 510, and thereafter, the coating liquid (B) 114c can also be applied in the solution coating treatment chamber (B) 514. Of course, the combination of colors is free and the coating liquid (R) 114a and the coating liquid (B) 114c may be applied in the solution coating treatment chamber (A) 510, and the coating liquid (G) 114b may be applied in the solution coating treatment chamber (B) 514.

Note that the structure of this embodiment may be carried out by combination with the structure of the embodiment 2.

[Embodiment 6]

Figure 2C:
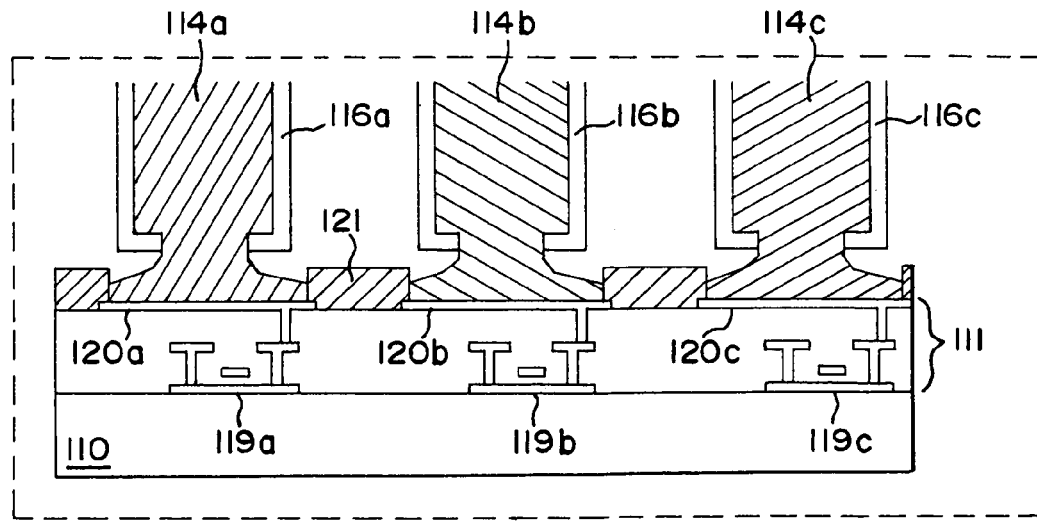
Figure 7:
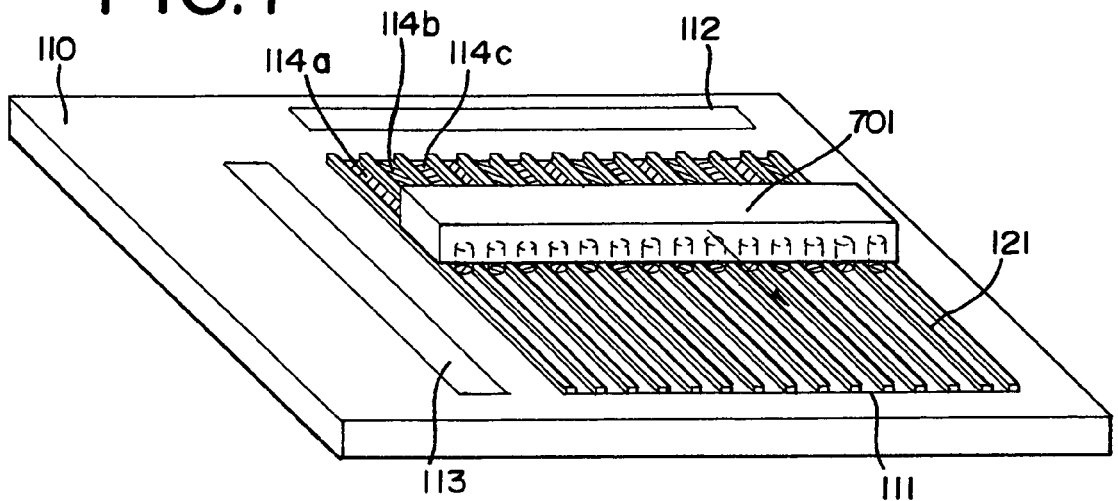
FIG. 7 is a view showing a coating step of an, organic EL material.

Although the example in which three nozzles are attached to the head portion 107 shown in FIGS. 2A to 2C has been described, more than three nozzles corresponding to plural pixel lines may be further provided. An example is shown in FIG. 7. The characters R, G and B in the drawing correspond to red, green and blue.

FIG. 7 shows an example in which an organic EL material (strictly speaking, coating liquid) is applied on all pixel lines formed in a pixel portion at the same time. That is, the number of nozzles attached to a head portion 701 is equal to the number of pixel lines. By adopting such structure, it becomes possible to coat all pixel lines by one scanning so that the throughput is remarkably improved.

Besides, the pixel portion is divided into plural zones, and a head portion provided with nozzles, the number of which is equal to the number of pixel lines contained in each zone, may be used. That is, when the pixel portion is divided into n zones, and when scanning is performed n times, it is possible to coat the organic EL material (strictly speaking, coating liquid) on all pixel lines.

Actually, since there is a case where the size of a pixel is as small as several tens μm, there is a case where the width of a pixel line also becomes several tens μm. In such a case, since it becomes difficult to arrange the nozzles horizontally in one line, it is necessary to contrive the arrangement of nozzles.

Figure 8A:
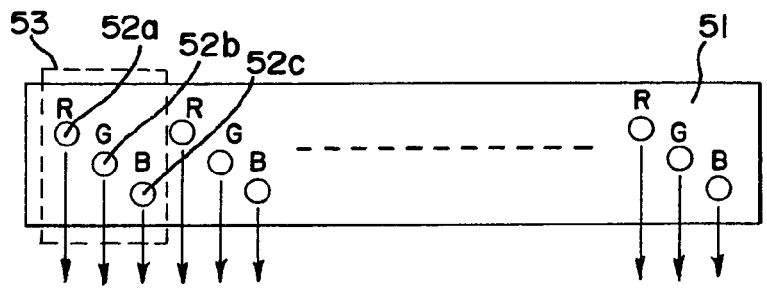
FIGS. 8A to 8C are views respectively showing the structure of a head portion provided in a thin film forming apparatus.
Figure 8B:
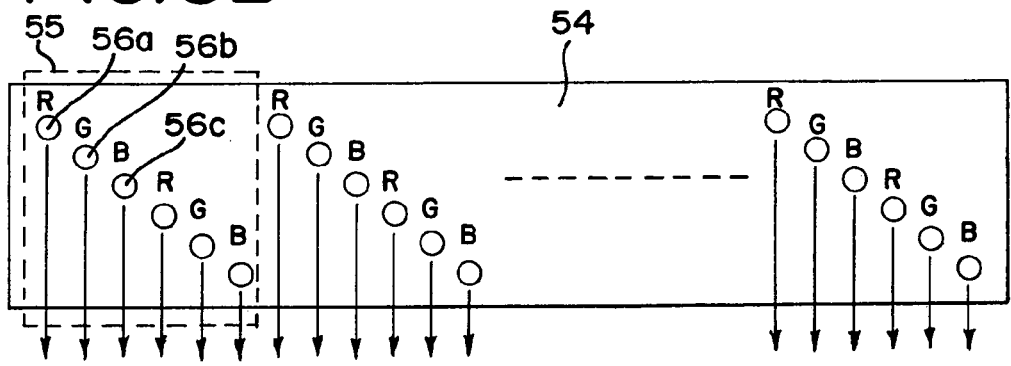
Figure 8C:
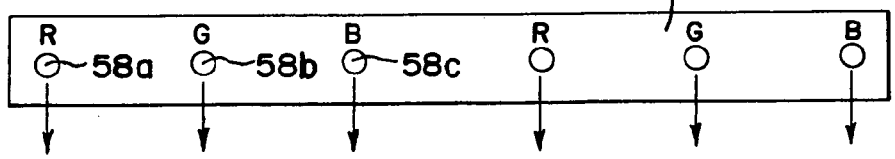

FIGS. 8A to 8C show examples in which attachment positions of nozzles to the head portion are changed. FIG. 8A shows an example in which nozzles 52a to 52c are formed while they are obliquely shifted to the head portion 51. Note that reference numeral 52a designates a nozzle for applying a coating liquid (R); 52b, a nozzle for applying a coating liquid (G); and 52c, a nozzle for applying a coating liquid (B). Each line of arrows corresponds to a pixel line.

As designated by 53, the nozzles 52a to 52c are regarded as one unit, and one to plural units are provided at the head portion. One unit 53 coats the organic EL materials on three pixel lines at the same time, and n units 53 coat the organic EL materials on 3n pixel lines at the same time.

By adopting such structure, the degree of freedom in the arrangement space of nozzles can be raised, and it becomes possible to unforcedly carry out the present intention to the pixel portion with high fineness. Besides, it is also possible to process all pixel lines in the pixel portion at the same time by using the head portion 51 of FIG. 8A, or it is also possible to divide the pixel portion into plural zones and to perform processing several times.

Next, a head portion 54 shown in FIG. 8B is a modification of FIG. 8A, and is an example in which the number of nozzles contained in one unit 55 is increased. That is, in the unit 55, two nozzles 56a each coating a coating liquid (R), two nozzles 56b each coating a coating liquid (G), and two nozzles 56c each coating a coating liquid (B) are included, and the organic EL materials are applied on six pixel lines in total at the same time by the one unit 55.

In this embodiment, one to plural such units 55 are provided, and when the one unit 55 is provided, the organic EL materials are applied on the six pixel lines at the same time, and when the n units are provided, the organic EL materials are applied on 6n pixel lines at the same time. Of course, it is not necessary to limit the number of nozzles provided in the unit 55 to six, but it is also possible to provide plural nozzles further.

In such structure as well, similarly to the case of FIG. 8A, all pixel lines in the pixel portion can be processed at the same time, or it is possible to divide the pixel portion into plural zones and to perform processing several times.

Besides, a head portion 57 as shown in FIG. 8C can also be used. In the head portion 57, a nozzle 58a for coating a coating liquid (R), a nozzle 58b for coating a coating liquid (G), and a nozzle 58c for coating a coating liquid (B) are provided at intervals of a space for three pixel lines.

When this head portion 57 is first scanned one time to coat the organic EL materials on pixel lines, next, the head portion 57 is shifted right by three pixel lines and scanning is again made. Further, the head portion 57 is shifted right by three pixel lines and scanning is again made. By performing the scan three times as described above, it is possible to coat the organic EL materials in the stripe shapes arranged in order of red, green and blue.

In such structure as well, similarly to the case of FIG. 8A, all pixel lines in the pixel portion can be processed at the same time, or it is also possible to divided the pixel portion into plural zones and to perform processing several times.

As described above, in the thin film forming apparatus shown in FIG. 1, by contriving the positions of nozzles attached to the head portion, it becomes possible to carry out the present invention even for a pixel portion with high fineness and with a narrow pixel pitch (distance between pixels). Then, the throughput of a manufacturing process can be raised.

Note that the structure of this embodiment can be freely combined with any structure of the embodiments 1 to 5 to be carried out.

[Embodiment 7]

In the embodiment 1, although the common chamber 501 is made to have a reduced pressure atmosphere, an atmosphere of atmospheric pressure filled with an inert gas may be adopted. In that case, the exhaust pump may not be provided in the transport chamber (A) 504, the pre-treatment chamber 506, the firing treatment chamber (A) 507, and the firing treatment chamber (B) 511.

However, since the transporting mechanism (A) 502, the transporting mechanism (B) 508, and the transporting mechanism (C) are provided in the common chamber 501, the transport chamber (B) 509, and the transport chamber (C) 513, respectively, there is a high possibility that the filled inert gas is polluted. Thus, it is preferable to make such a structure that the common chamber 501, the transport chamber (B) 509, and the transport chamber (C) 513 are made a state where the pressure is lower than the other treatment chambers, and the inert gas is made to flow into the common chamber 501, the transport chamber (B) 509, and the transport chamber (C) 513.

Note that the structure of this embodiment can be freely combined with any structure of the embodiments 3 to 6 to be carried out.

[Embodiment 8]

Although the embodiment 3 shows the example in which the pre-treatment chamber 506 is provided with the mechanism for irradiating ultraviolet light and the mechanism for performing the heating treatment, this embodiment shows an example in which the pre-treatment chamber 506 is provided with a mechanism for performing a plasma treatment.

In the case where a pre-treatment is performed to the surface of a cathode of an EL element, it is desirable to remove a natural oxide of the surface of the cathode. This embodiment includes a mechanism for removing the natural oxide by performing a plasma treatment to the surface of the cathode using a gas containing fluorine or chlorine.

Note that the structure of this embodiment can be freely combined with any structure of the embodiments 3 to 7 to be carried out.

[Embodiment 9]

Although the embodiment 3 shows the example in which the pre-treatment chamber 506 is provided with the mechanism for irradiating ultraviolet light and the mechanism for performing the heat treatment, this embodiment shows an example in which the pre-treatment chamber 506 is provided with a mechanism for performing a sputtering treatment.

In the case where a pre-treatment is performed to the surface of a cathode of an EL element, it is desirable to remove a natural oxide of the surface of the cathode. This embodiment includes a mechanism for removing the natural oxide by performing a sputtering treatment to the surface of the cathode using an inert gas such as rare gases or nitrogen.

Note that the structure of this embodiment can be freely combined with any structure of the embodiments 3 to 8 to be carried out.

[Embodiment 10]

The embodiment 3 shows the example in which the organic EL material, which becomes a luminescent layer, is formed through the solution coating treatment chamber (A) 510 and the firing treatment chamber (A) 507, and further, the organic EL material, which becomes a hole injection layer or hole transport layer, is formed through the solution coating treatment chamber (B) 514 and the firing treatment chamber (B) 511.

However, it is also possible to make such structure that first, an electron injection layer or electron transport layer is formed through the solution coating treatment chamber (B) 514 and the firing treatment chamber (B) 511, and further, an organic EL material, which becomes a luminescent layer, is formed through the solution coating treatment chamber (A) 510 and the firing treatment chamber (A) 507, and still further, an organic EL material, which becomes a hole injection layer or hole transport layer, is formed through the solution coating treatment chamber (B) 514 and the firing treatment chamber (B) 511.

That is, in the case where it is desired to selectively coat the organic EL materials (B) of red, green and blue by using the thin film forming apparatus of FIGS. 1A and 1B, the solution coating chamber (A) 510 is used, and in the case where the organic EL material which may be provided at the entire surface of the substrate is formed, the solution coating treatment chamber (B) 514 may be used. It is possible to form EL layers of various laminate structures by selectively using these solution coating treatment chambers.

Note that the structure of this embodiment can be freely combined with any structure shown in the embodiments 3 to 9 to be carried out.

[Embodiment 11]

Although the embodiment 3 shows the example in which the conductive film, which becomes a cathode or anode, is formed in the vapor phase film forming treatment chamber (A) 515, here, the organic EL material can also be formed by a vapor deposition method. That is, it can be used when a layer selected from a hole injection layer, a hole transport layer, an electron injection layer and an electron transport layer is formed.

By changing a vapor deposition source, the vapor phase film forming chamber (A) 515 can also form both films of the organic EL material and the conductive film. It is also possible to form the organic EL material by the vapor phase film forming treatment chamber (A) 515 and to form the conductive film, which becomes the cathode or anode, by the vapor phase film formation treatment chamber (B) 516.

Note that the structure of this embodiment can be freely combined with any structure shown in the embodiments 3 to 10 to be carried out.

As described above, by using the thin film forming apparatus of the present invention, it becomes possible to form the organic EL material certainly without a problem like the flying curve in the ink-jet method. That is, since the film of the high molecular organic EL material can be formed precisely without a problem of positional deviation, the manufacture yield of the EL display device using the high molecular organic EL material can be improved.

Compound 1

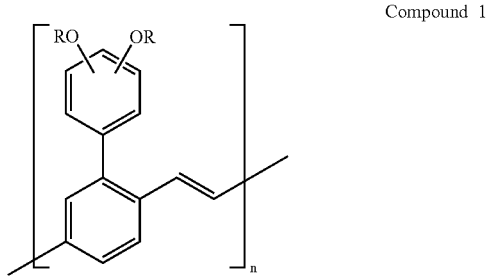

-continued

Compound 2

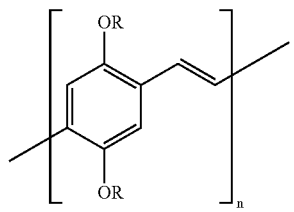

Compound 3

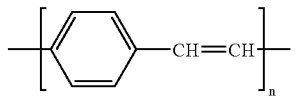

Compound 4

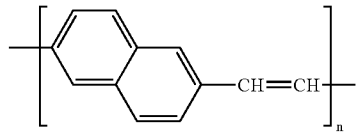

Compound 5

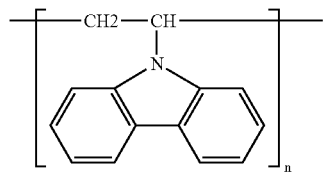

What is claimed is:

1. A method for manufacturing a semiconductor device, comprising:

forming at least first and second source signal lines extending in a first direction over a substrate, wherein the first source signal line is connected to a plurality of thin film transistors and the second source signal line is connected to a plurality of thin film transistors;

forming at least a first stripe shape bank over the first source signal line and a second stripe shape bank over the second source signal line, wherein the first and second stripe shape banks extend in the first direction; and applying a solution comprising an organic material onto at least two pixels extending along the first direction between the first and second stripe shape banks continuously using a dispenser.

2. A method according to claim 1, wherein the first stripe shape bank completely overlap the first source signal line at least in a region along the two pixels; and wherein the second stripe shape bank completely overlap the second source signal line at least in a region along the two pixels.

3. A method according to claim 1, wherein the organic material comprises a light emitting material.

4. A method according to claim 1, wherein the solution is continuously applied onto from a pixel of one end of a pixel portion to an opposed end of the pixel portion between the first and second stripe shape banks.

5. A method for manufacturing a semiconductor device, comprising:

forming at least first and second source signal lines extending in a first direction over a surface of a substrate, wherein the first source signal line is connected to a plurality of thin film transistors and the second source signal line is connected to a plurality of thin film transistors;

forming at least a first stripe shape bank over the first source signal line and a second stripe shape bank over the second source signal line, wherein the first and second stripe shape banks extend in the first direction;

applying a solution comprising an organic material between the first and second stripe shape banks, wherein the solution is continuously applied onto at least two pixels extending along the first direction using a dispenser;

heating the solution for forming a light emitting layer;

directing the surface of the substrate downward; and depositing a material toward the surface directed downward in order to form a film adjacent to the light emitting layer.

6. A method according to claim 5, wherein the first stripe shape bank completely overlap the first source signal line at least in a range along the two pixels; and wherein the second stripe shape bank completely overlap the second source signal line at least in a range along the two pixels.

7. A method according to claim 5, wherein the organic material comprises a light emitting material.

8. A method according to claim 5, wherein the solution is continuously applied onto from a pixel of one end of a pixel portion to an opposed end of the pixel portion between the first and second stripe shape banks.

9. A method for manufacturing a semiconductor device, comprising:

forming a plurality of source signal lines extending in a first direction and a plurality of gate signal lines extending in a second direction perpendicular to the first direction over a substrate;

forming a bank over the plurality of source signal lines and the plurality of gate signal lines, wherein the bank is extending in the first and second directions, and wherein a plurality of regions arranged in a matrix form are separated by the bank;

applying a solution comprising an organic material in the plurality of regions, wherein the solution is continuously applied onto at least two pixels in one of the plurality of regions.

10. A method according to claim 9, wherein the organic material comprises a light emitting material.

11. A method for manufacturing a semiconductor device, comprising:

forming a plurality of source signal lines extending in a first direction and a plurality of gate signal lines extending in a second direction perpendicular to the first direction over a surface of a substrate;

forming a bank over the plurality of source signal lines and the plurality of gate signal lines, wherein the bank is extending in the first and second directions, and wherein a plurality of regions arranged in a matrix form are separated by the bank;

applying a solution comprising an organic material in the plurality of regions, wherein the solution is continuously applied onto at least two pixels in one of the plurality of regions, heating the solution for forming a plurality of light emitting layers;

directing the surface of the substrate downward; and depositing a material toward the surface directed downward in order to form a film adjacent to the light emitting layer.

12. A method according to claim 11, wherein the organic material comprises a light emitting material.

13. A method for manufacturing a semiconductor device, comprising:

forming at least first and second signal lines extending in a first direction over a substrate, wherein the first signal line is connected to a plurality of thin film transistors and the second signal line is connected to a plurality of thin film transistors;

forming at least a first stripe shape bank over the first signal line and a second stripe shape bank over the second signal line, wherein the first and second stripe shape banks extend in the first direction; and applying a solution comprising an organic material onto at least two pixels extending along the first direction between the first and second stripe shape banks continuously using a dispenser.

14. A method according to claim 13, wherein the first stripe shape bank completely overlap the first signal line at least in a region along the two pixels; and wherein the second stripe shape bank completely overlap the second signal line at least in a region along the two pixels.

15. A method according to claim 13, wherein the organic material comprises a light emitting material.

16. A method according to claim 13, wherein the solution is continuously applied onto from a pixel of one end of a pixel portion to an opposed end of the pixel portion between the first and second stripe shape banks.

17. A method for manufacturing a semiconductor device, comprising:

forming at least first and second signal lines extending in a first direction over a surface of a substrate, wherein the first signal line is connected to a plurality of thin film transistors and the second signal line is connected to a plurality of thin film transistors;

forming at least a first stripe shape bank over the first signal line and a second stripe shape bank over the second signal line, wherein the first and second stripe shape banks extend in the first direction;

applying a solution comprising an organic material between the first and second stripe shape banks, wherein the solution is continuously applied onto at least two pixels extending along the first direction continuously using a dispenser;

heating the solution for forming a light emitting layer;

directing the surface of the substrate downward; and depositing a material toward the surface directed downward in order to form a film adjacent to the light emitting layer.

18. A method according to claim 17, wherein the first stripe shape bank completely overlap the first signal line at least in a range along the two pixels; and wherein the second stripe shape bank completely overlap the second signal line at least in a range along the two pixels.

19. A method according to claim 17, wherein the organic material comprises a light emitting material.

20. A method according to claim 17, wherein the solution is continuously applied onto from a pixel of one end of a pixel portion to an opposed end of the pixel portion between the first and second stripe shape banks.

21. A method for manufacturing a semiconductor device, comprising:

forming at least first, second, third and fourth source signal lines extending in a first direction over a substrate, wherein each of the first second, third and fourth source signal line is connected to a plurality of thin film transistors;

forming at least first second, third and fourth stripe shape banks each over one of the first second, third and fourth source signal line, wherein the first second, third and fourth stripe shape banks extend in the first direction;

applying a first solution comprising a material emitting red light when a voltage being applied onto at least two pixels extending along the first direction between the first and second stripe shape banks continuously using a dispenser, applying a second solution comprising a material emitting green light when a voltage being applied onto at least two pixels extending along the first direction between the second and third stripe shape banks continuously using a dispenser, and applying a third solution comprising a material emitting blue light when a voltage being applied onto at least two pixels extending along the first direction between the third and fourth stripe shape banks continuously using a dispenser.

* * * * *